(12) United States Patent
Shanbhag et al.

(10) Patent No.: US 9,697,877 B2
(45) Date of Patent: Jul. 4, 2017

(54) COMPUTE MEMORY

(71) Applicant: THE BOARD OF TRUSTEES OF THE UNIVERSITY OF ILLINOIS, Urbana, IL (US)

(72) Inventors: Naresh Shanbhag, Champaign, IL (US); Mingu Kang, Savoy, IL (US); Min-Sun Keel, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 0 days.

(21) Appl. No.: 14/614,743

(22) Filed: Feb. 5, 2015

(65) Prior Publication Data

US 2016/0232951 A1 Aug. 11, 2016

(51) Int. Cl.
*G11C 8/08* (2006.01)
*G11C 7/12* (2006.01)
*G11C 7/10* (2006.01)
*G11C 7/16* (2006.01)
*G11C 8/04* (2006.01)
*G11C 11/418* (2006.01)
*G11C 11/419* (2006.01)

(52) U.S. Cl.
CPC ............. *G11C 7/12* (2013.01); *G11C 7/1006* (2013.01); *G11C 7/16* (2013.01); *G11C 8/04* (2013.01); *G11C 8/08* (2013.01); *G11C 11/418* (2013.01); *G11C 11/419* (2013.01)

(58) Field of Classification Search
CPC .................................... G11C 7/10; G11C 7/12
See application file for complete search history.

(56) References Cited

U.S. PATENT DOCUMENTS

| | | | | |
|---|---|---|---|---|
| 6,091,640 A | * | 7/2000 | Kawahara | G11C 7/1045 365/185.22 |
| 2002/0089473 A1 | * | 7/2002 | Yamazaki | G09G 3/22 345/75.2 |
| 2003/0095450 A1 | * | 5/2003 | Tanaka | G11C 16/10 365/200 |
| 2004/0076054 A1 | * | 4/2004 | Takahashi | G11C 11/406 365/200 |
| 2008/0285362 A1 | * | 11/2008 | Kang | G11C 11/22 365/189.16 |

(Continued)

OTHER PUBLICATIONS

Genov, Roman; "Kerneltron: Support Vector "Machine" in Silicon"; IEEE Transactions on Neural Networks, vol. 14, No. 5; Sep. 2003; 9 pages.

(Continued)

*Primary Examiner* — Khamdan Alrobaie
(74) *Attorney, Agent, or Firm* — Talem IP Law, LLP

(57) ABSTRACT

A compute memory system can include a memory array and a controller that generates N-ary weighted (e.g., binary weighted) access pulses for a set of word lines during a single read operation. This multi-row read generates a charge on a bit line representing a word stored in a column of the memory array. The compute memory system further includes an embedded analog signal processor stage through which voltages from bit lines can be processed in the analog domain. Data is written into the memory array in a manner that stores words in columns instead of the traditional row configuration.

22 Claims, 16 Drawing Sheets

(56) References Cited

U.S. PATENT DOCUMENTS

2012/0206988 A1* 8/2012 Song .................. G11C 5/145
365/203

OTHER PUBLICATIONS

Kang, Mingu et al.; "Compute Memory: An Energy-efficient Memory-intensive Inference Kernel"; Semiconductor Research Corporation; Research Publication ID: P070649; Jul. 28, 2014; 10 pages.
Kang, Mingu et al.; "An Energy-Efficient VLSI Architecture for Pattern Recognition Via Deep Embedding of Computation in SRAM"; Conference Paper for IEEE International Conference on Acoustic, Speech and Signal Processing (ICASSP); May 4-9, 2014; 5 pages.

* cited by examiner

COMPUTE MEMORY

This invention was made with government funds under Contract No. HR0011-10-3-0002 awarded by DARPA. The U.S. Government has rights in this invention.

BACKGROUND

Emerging applications such as in health care, social networks, smart infrastructure, surveillance, and monitoring (including embedded-sensor networks, Business Intelligence data analytics, and computer vision) generate and consume massive data volumes. The consumption of these massive data volumes often includes application of statistical inference techniques, particularly machine learning algorithms, to extract informative patterns of interest. In such systems, energy consumption in memory subsystems tends to dominate system energy-efficiency. In addition, system through-put is often limited by the bandwidth between memory and logic in the applications.

Memory-intensive applications, such as pattern recognition, work most efficiently when higher bandwidth between memory and logic is available since there may only be a few logic operations per memory fetch. To reduce power consumption and increase throughput in memory-intensive applications, 3D integrated circuits, embedded memory (e.g., eDRAM), processor-in-memory (PIM) architectures, associative memories, and low-power memory design are being explored.

BRIEF SUMMARY

Compute memory systems and techniques are described. Compute memory utilizes a multi-row read configuration and embedded analog signal processing to perform computations including addition, subtraction, absolute, multiplication, inner product, division, and combinations thereof.

A compute memory system can include a memory array and a controller that generates N-ary weighted access pulses for a set of word lines during a single read operation. The compute memory system further includes an embedded analog signal processor stage through which voltages from bit lines can be processed in the analog domain. Data is written into the memory array in a manner that stores words in columns instead of the traditional row configuration.

Compute memory can achieve energy efficiency due to low-voltage swing operation both in memory read and computation processes. In addition, since the compute memory bit-cell array structure can be identical to that of a standard memory array, the storage density and the read/write functionality of the standard memory array are preserved without incurring delay and energy penalties. Compute memory can further reduce delay through its intrinsically parallel column-wise operation, thereby overcoming a limited IO bus width between memory and computation logics.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 3A illustrates an SRAM implementation, FIG. 3B illustrates a PRAM or ReRAM implementation, and FIG. 3C illustrates a NAND flash memory implementation.

FIG. 11A shows a schematic representation of an analog processing component for multiplication and FIG. 11B illustrates a timing diagram for the switches.

DETAILED DISCLOSURE

Compute memory systems and techniques are described. Compute memory utilizes a multi-row read configuration and embedded analog signal processing to perform computations including addition, subtraction, absolute, multiplication, inner product, division, and combinations thereof. The described systems can be application-specific, for example, a devoted inference kernel for pattern recognition, or part of a general purpose computing system that utilizes the compute memory system for a variety of computations.

Figure 1:
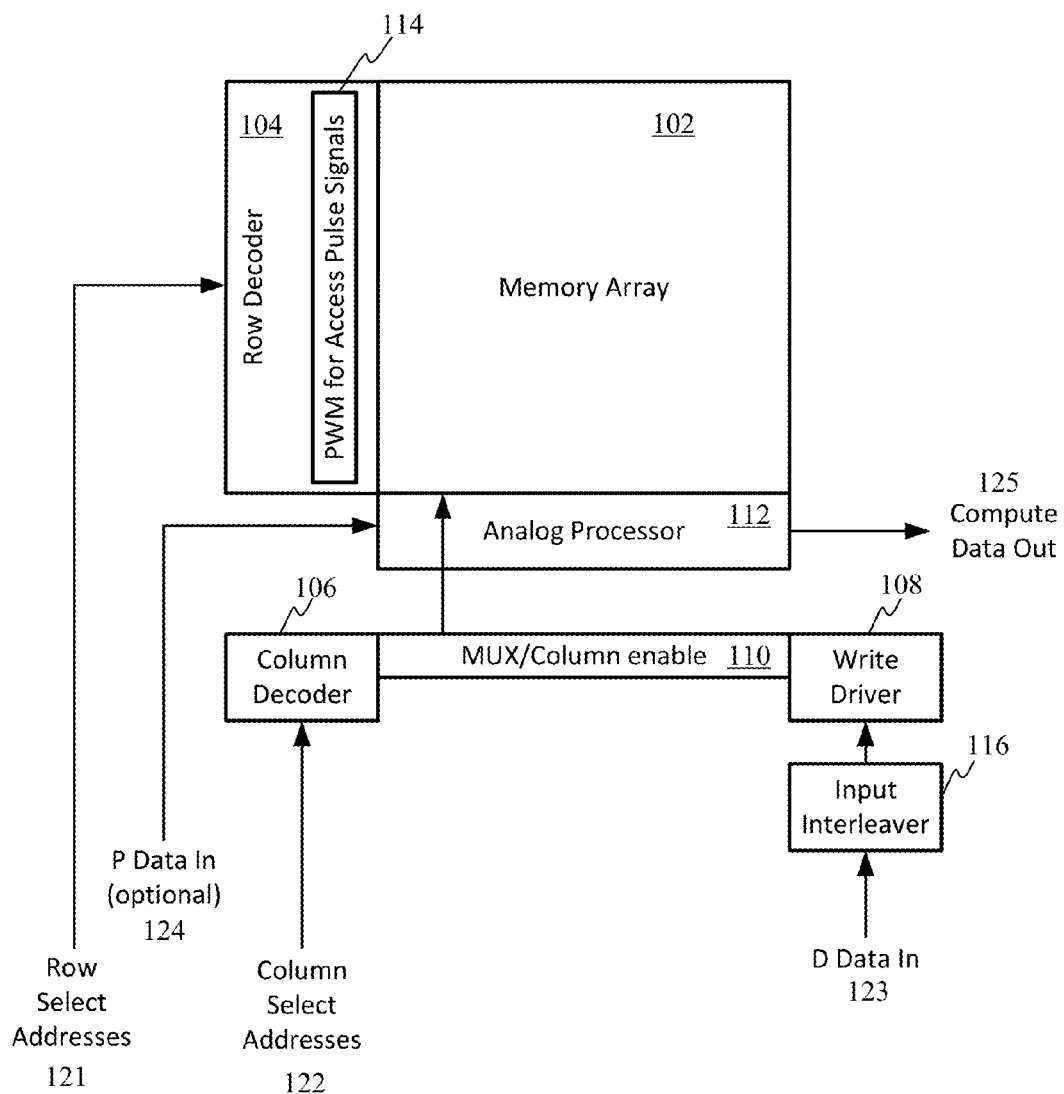
FIG. 1 illustrates an implementation of a compute memory architecture.

FIG. 1 illustrates an implementation of a compute memory architecture. Referring to FIG. 1, a compute memory architecture 100 takes advantage of existing memory array architectures and their energy and design efficiencies by using any suitable highly dense memory array 102 such as a static random access memory (SRAM), flash, dynamic random access memory (DRAM), or even a phase change memory (PRAM) or resistive random-access memory (ReRAM), and the operating logic such as a row decoder 104, column decoder 106, write driver 108, and a multiplexer (MUX)/column enable 110. Since conventional memory architectures can be used, in some cases, conventional memory operations may be carried out using the compute memory architecture 100 when it is not in a compute memory mode.

For performing compute memory processes, the compute memory architecture 100 includes an embedded analog processor 112 and a pulse width modulator (PWM) for access pulse signals 114. The analog processor 112 can include components such as replica cells, comparators, capacitive adders, and/or capacitive multipliers (see examples illustrated in FIGS. 8-12). The PWM 114 can be used to generate N-ary weighted access pulses so that different rows of the memory array 102 may be applied with pulses of different widths (e.g., the length of time a voltage is applied to the word lines). N-ary weighting refers to the application of a base 2 or more weight (N=an integer starting at 2). For example, a binary weighting occurs where each weighted element is double the other. For example, binary weighted pulse widths are weighted with 1, 2, 4, 8, etc., so the second pulse width is twice the width of the first, the third pulse width is twice the width of the second, etc. Specific examples are described with respect to binary weighted access pulses for simplicity; however, some implementations may apply base 3, base 4 or higher weighted pulses.

As described in more detail with respect to FIGS. 3A-3C and 4, the PWM 114 is used to generate binary weighted (or other N-ary weighted) pulses for a multi-row read. The PWM 114 can be part of a sequencer or other logic connected to the rows of the memory array 102. In some implementations, a sequencer is included with the row decoder as a simplified controller for sequentially selecting rows of the memory array. That is, in some cases, instead of complex row decoder, a simple sequencer may be used to sequentially select a row from top to bottom.

The described compute memory techniques utilize column-wise data. Since conventional memory architectures usually uses a row decoder 104 to drive data into a particular row when writing data, an input interleaver 116 is included to enable words to be written into memory in columns that break across multiple rows. The interleaver 116 is a register block used to change direction of data from horizontal manner to vertical manner.

Input signals (other than power and ground lines) to the compute memory include address select, which provides the row select address 121 and the column select address 122 (either from a single address input or from two separate signals), and the data D 123 input. In some cases, a P data 124 (e.g., template data) input line is included to enable certain functions to be carried out (described in more detail later). Output signals from compute memory include the compute data output 125. Conventional memory output (not shown) may also be available.

Compute memory can be used for any application that involves computations such as addition, subtraction, multiplication, absolute difference, and many others. Compute memory is particularly suited for handling pattern recognition, including inference type pattern recognition, Hamming distance computation, and cross correlations just as a few examples.

Figure 2A:
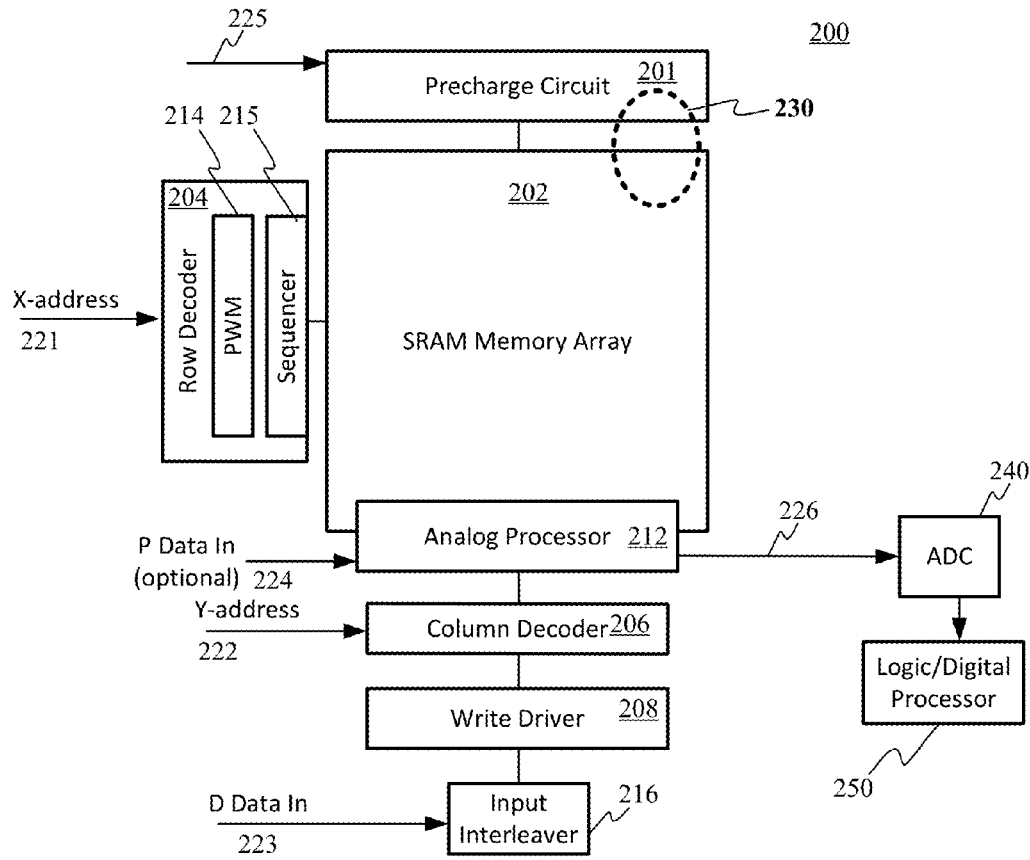
FIGS. 2A-2C illustrate an SRAM implementation of a memory array, and SRAM cell, for a compute memory architecture.
Figure 2B:
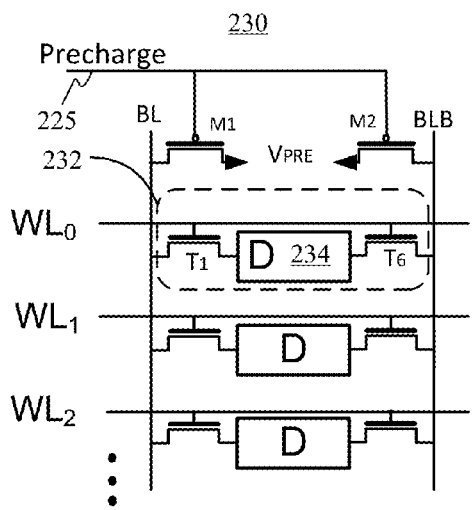
Figure 2C:
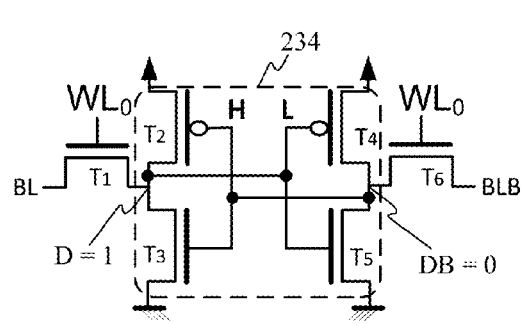

FIGS. 2A-2C illustrate an SRAM implementation of a memory array, and SRAM cell, for a compute memory architecture such as illustrated in FIG. 1. Referring to FIG. 2A, an example SRAM-based compute memory architecture 200 includes a precharge circuit 201 for the SRAM memory array 202, a row decoder 204, a column decoder 206, and a write driver 208. As with the compute memory architecture 100, the SRAM-based compute memory architecture 200 includes an analog processor 212. The row decoder 204 can include a PWM component 214 such as described with respect to the PWM 114 of FIG. 1. Row decoder 204 can also include a sequencer 215. The column decoder 206 may include the MUX/column enable 110 as described with respect to FIG. 1. In some cases, the column decoder 206 includes a sequencer. An input interleaver 216 is included to facilitate the column-wise writing of data into the SRAM memory array 202.

As also with the architecture shown in FIG. 1, the input signals (other than power and ground) to the SRAM-based compute memory include address select, which provides the row select address X-address 221 and the column select address Y-address 222, and the data D 223 input line. The output signals from compute memory include the compute data output 226, which can be provided to an analog to digital converter 240 and logic/digital processor 250, one or both of which may be located off-chip. Conventional memory output (not shown) may also be available (via sense amplifiers—also not shown). In addition, as part of the input signals a P data 224 (e.g., template data) input line may be included to enable certain functions to be carried out (described in more detail later).

For the SRAM implementation, a precharge control signal 225 is also included. This signal may be generated by the memory controller (not shown). In detail, as illustrated in FIG. 2B, which corresponds to selection 230, a precharge control signal 225 is connected like a word line to the gates of precharge transistors M1 and M2 to apply a precharge voltage VPRE to bit lines (bit line BL and bit line bar BLB) of a column of memory cells. Each memory cell in the column is connected to both the bit line BL and the bit line bar BLB and a corresponding word line for its row (e.g., WL0, WL1, WL2, . . . ).

When the data D 223 is written into the memory cells via the write driver 208, the write driver 208 is used to discharge one of the bit lines (e.g., BL) from the precharge level to below the write margin of the SRAM cell while a word line is activated. A read operation also involves applying a precharge voltage to the bit lines and activating a word line to access, via access transistors T1 and T6, the data stored in the storage element 234 of the SRAM cell.

Taking the memory cell 232, which is shown in more detail in FIG. 2C, the access transistors T1 and T6 are connected by their gates to the word line WL0 and the storage element 234 is designed as a latch, involving—for this 6 transistor SRAM cell—transistors T2, T3, T4, and T5, forming two cross-coupled inverters. Writing a "1" into a cell involves driving or precharging the bit line BL of a particular column to VDD and driving or discharging BLB to 0 volts. The word line for the cell being written to is enabled (e.g., applied with a "high" voltage), turning on the access transistors T1 and T6. The left side transistor tries to pass VDD, while the right one tries to pass 0V (from BLB). If the word line WL0 is turned off, the storage element 234 stores a 1 (at output of T2 and T3, D=1) and a 0 (at output of T4 and T5, DB=0). To read from the cell, BL and BLB are precharged so both become full VDD voltage (assuming VPRE=VDD). The precharge transistors M1 and M2 are turned off and the word line WL) is turned on. If D=1, the precharged bit line stays high, but since DB=0, BLB discharges.

Compute memory transforms digital information into analog information and carries out certain computations in an analog processor. In particular, a two stage operation is performed by compute memory where the first stage is a multi-row read operation and the second stage is analog processing. The first stage, the multi-row read operation, is a digital to analog conversion process that generates an analog signal that is used by the embedded analog processor to perform the certain computations. For the SRAM-based compute memory architecture, the multi-row read command begins with a single pre-charge on the bit lines. Other memory-based compute memory architectures such as PRAM, ReRAM, and NAND flash memory can start with a pre-charge on the bit lines as well. An N-ary weighted pulse (generated by PWM 114, 214) is applied to multiple rows (via the word lines) so that what is created on the bit line from a column of memory cells represents multiple bits. The representation of the multiple bits is a weighted representation of a computational product that can be considered a decimal representation of the binary bits stored in the memory. This is illustrated in FIGS. 3A-3C and 4.

Figure 3A:
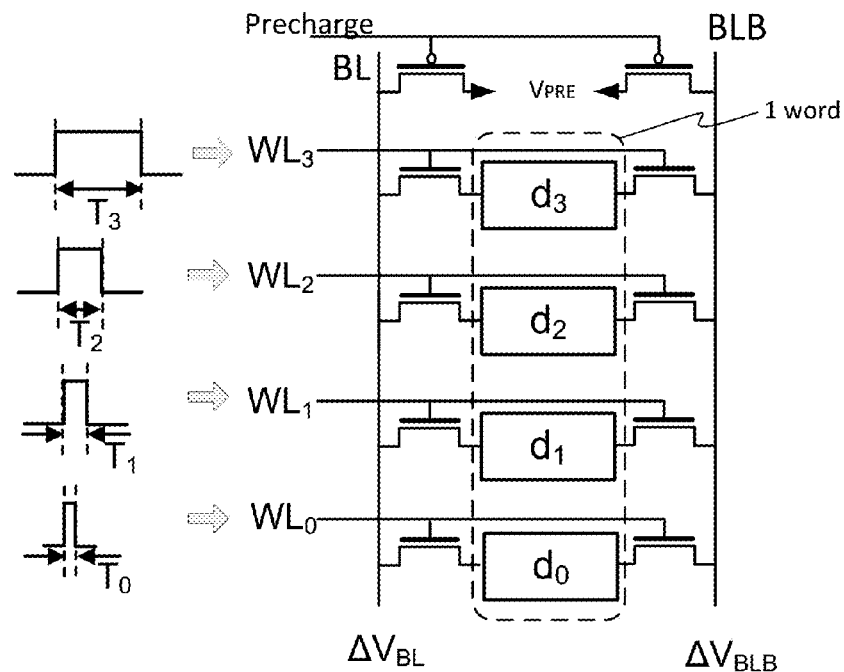
FIGS. 3A-3C illustrate a multi-row read operation for some example compute memory architectures and the corresponding pulse width modulated word line access signals.
Figure 3B:
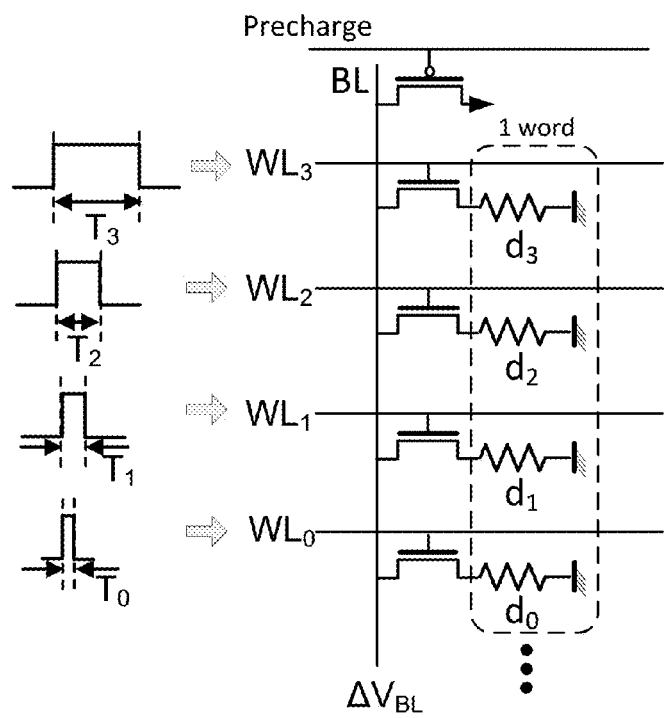
Figure 3C:
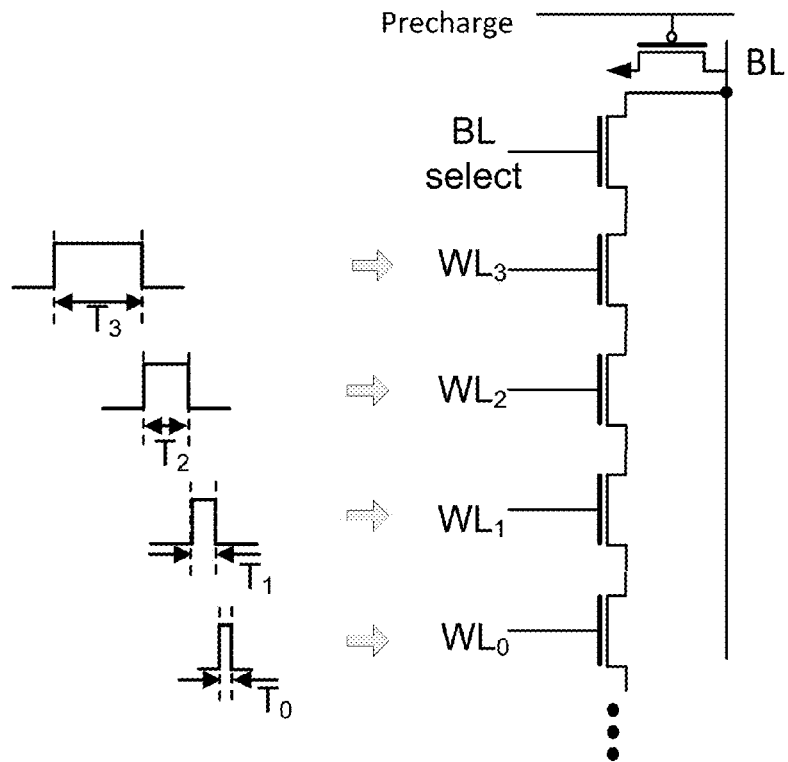
Figure 4:
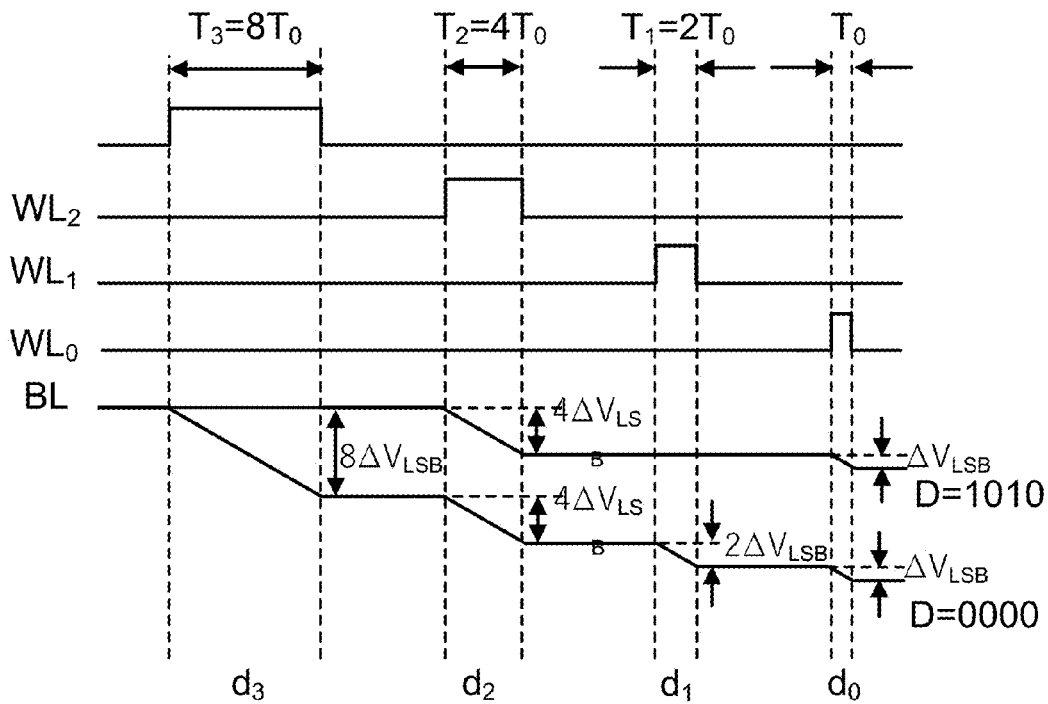
FIG. 4 illustrates a timing diagram for the multi-row read operation.

FIGS. 3A-3C illustrate a multi-row read operation for some example compute memory architectures and the corresponding pulse width modulated word line access signals. FIG. 3A illustrates an SRAM implementation, FIG. 3B illustrates a PRAM or ReRAM implementation, and FIG. 3C illustrates a NAND flash memory implementation. FIG. 4 illustrates a timing diagram for the multi-row read operation.

Referring to FIG. 3A, a four bit word (containing bits $d_0$, $d_1$, $d_2$, and $d_3$) is stored in a column such as described with respect to FIG. 2B. To perform a multi-row read out of the word, binary weighted pulses are applied to the word lines WL0, WL1, WL2, and WL3. In particular, a pulse of width $T_3=8T_0$ is applied to WL3, a pulse of width $T_2=4T_0$ is applied to WL2, a pulse of width $T_1=2T_0$ is applied to WL1, and a pulse of width To is applied to WL0.

For an SRAM implementation (or other memory array utilizing a precharge circuit in a similar manner), the multi-row read begins by performing a pre-charge operation to start BL and BLB from VDD. Then, binary weighted pulses are applied to the word lines. One row may be turned on at a time (sequentially or in any order) or all the rows may be turned on simultaneously. In this example, $d_3$ is the most significant bit and $d_0$ is the least significant bit. For this reason, $d_3$ is applied with the longest pulse width and each successive bit is applied with a corresponding decreasing pulse width.

Referring to FIG. 3B, a four bit word (containing the bits $d_0$, $d_1$, $d_2$, and $d_3$) is stored in a column of PRAM or ReRAM memory (represented as resistors in the figure). To perform a multi-row read out of the word, the binary weighted pulses are applied to the word lines WL0, WL1, WL2, and WL3. In particular, a pulse of width $T_3=8T_0$ is applied to WL3, a pulse of width $T_2=4T_0$ is applied to WL2, a pulse of width $T_1=2T_0$ is applied to WL1, and a pulse of width $T_0$ is applied to WL0. Similar to the SRAM implementation of FIG. 3A, the multi-row read begins by performing a pre-charge operation to initialize the voltage on BL to VDD. Then, binary weighted pulses are applied to the word lines. One row may be turned on at a time (sequentially or in any order) or all the rows may be turned on simultaneously. In this example, $d_3$ is the most significant bit and $d_0$ is the least significant bit. For this reason, $d_3$ is subject to the longest pulse width and each successive bit receives a corresponding decreasing pulse width.

Referring to FIG. 3C, the memory column has a same structure as conventional NAND flash memory. To perform a multi-row read out of the word, the binary weighted pulses are applied to the word lines WL0, WL1, WL2, and WL3. In particular, a pulse of width $T_3=8T_0$ is applied to WL3, a pulse of width $T_2=4T_0$ is applied to WL2, a pulse of width $T_1=2T_0$ is applied to WL1, and a pulse of width To is applied to WL0. In the case of the NAND flash memory-based compute memory, the pulses are not overlapped so as to minimize resistance of the serially connected structure.

Turning to FIG. 4, if the memory cells are storing 0000 (also referred to as 0000b for SRAM implementation since the latch of the SRAM cell holds a value at its node by the bit bar line that would appear as 1111), when WL3 is applied with the access signal with pulse width T3, the BL discharges because $d_3$ is storing 0. Interestingly, the voltage drop is proportional to pulse width. This enables a different impact to be given for different bit position. Therefore, the voltage drop ($\Delta VBL$) that can be sensed from the bit line BL after enabling WL3 with $T_3=8T_0$ is the change in voltage for the least significant bit ($\Delta V_{LSB}$) times eight ($8\Delta V_{LSB}$). Accordingly, the analog voltage level of BL corresponds to the stored value of $d_3$, $d_2$, $d_1$, and $d_0$, resulting in what is effectively a digital-to-analog conversion. For example, when the data is 0000, the voltage drop in BLB ($\Delta VBLB$) is 0. In contrast, when the data is 1010 (also illustrated in FIG. 4), the $\Delta VBLB$ is $5\Delta V_{LSB}$.

The multi-row read operation saves energy because it requires only one precharge operation to read multiple bits. In addition, high bandwidth can be achieved because each bit line outputs a word information instead of a single bit information.

For a single precharge and no additional circuitry, four, five, or six bits may be read out in the manner illustrated in FIGS. 3A-3C. The number of bits that can be read out after a single precharge depends on the accuracy needed for the output. Because of the voltage dependence of resistances of the transistors in the discharge path, the non-linearity of the multi-row read increases with the number of bits that can be read out with a single precharge of the bit lines.

Figure 5A:
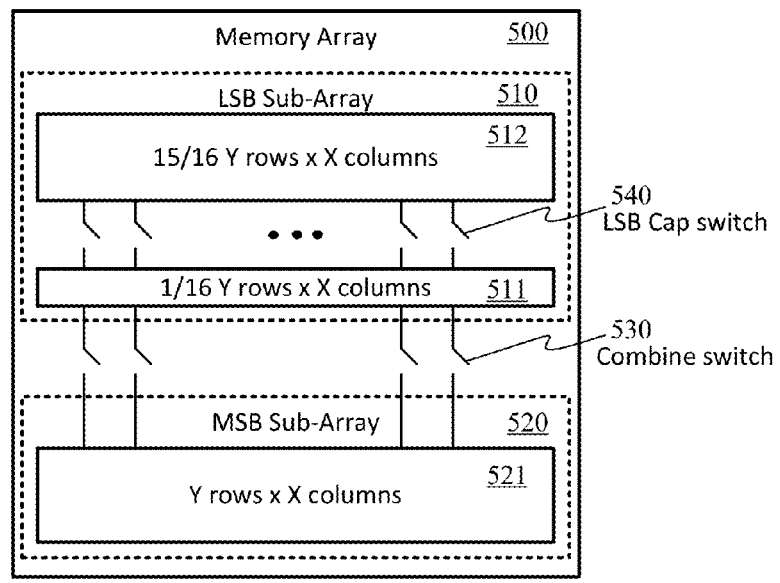
FIG. 5A illustrates a multi-row read configuration for compute memory that enables a sub-ranged read technique.
Figure 5B:
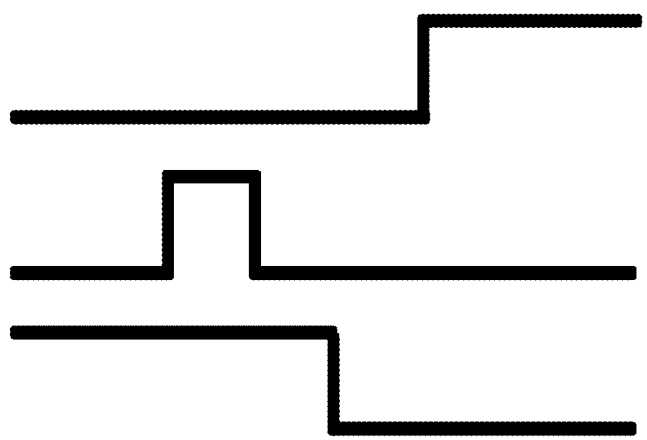
FIG. 5B illustrates a corresponding timing diagram for the configuration illustrated in FIG. 5A.

FIG. 5A illustrates a multi-row read configuration for compute memory that enables a sub-ranged read technique to enhance the accuracy of multi-row read; and FIG. 5B illustrates a corresponding timing diagram for the configuration illustrated in FIG. 5A. In particular, FIG. 5A illustrates a configuration for reading eight bits. Here, the memory array 500 is split into a least significant bit (LSB) sub-array 510 and a most significant bit (MSB) sub-array 520, where the BL and BLB lines connected to the columns of memory cells are controllably disconnected and reconnected via switches 530 between the LSB sub-array 510 and MSB sub-array 520.

At the beginning of a multi-row read, the BL and BLB lines between the MSB sub-array 520 and the LSB sub-array 510 are disconnected via the switches 530. Four bits stored in the memory cells 521 of the MSB sub-array 520 and four bits stored in the memory cells 511 or 512 of the LSB sub-array 510 can undergo a multi-row read in parallel to develop the corresponding voltages on the respective sub-arrays with the LSB capacitor switches 540 closed. Then, the switches 540 are opened, and the bit line of the column is connected via the switches 530. The charges on the bit line are added together by weighting the MSB charge more than the LSB charge. The charge sharing equation is $16CV_{MSB} + CV_{LSB} = 17CV_{BL}$; thus, $$V_{BL} = \frac{16}{17}\left(V_{MSB} + \frac{1}{16}V_{LSB}\right).$$

A representation of the weighting is illustrated by the 15/16 Y rows of memory cells 512 separated from the 1/16 Y rows of memory cells 511 by the LSB capacitor switches 540. By charge-sharing the separated 1/16 partial BL from the cells 511 in the LSB sub-array 510 and a full BL from the MSB sub-array 520, the word with 8 bits is expressed by giving 16 times larger impact to the 4-bit MSB as compared to the 4-bit LSB. That is, a 1/16 weight to a bit line voltage representing the least significant bits can be applied via charge sharing.

Figure 6:
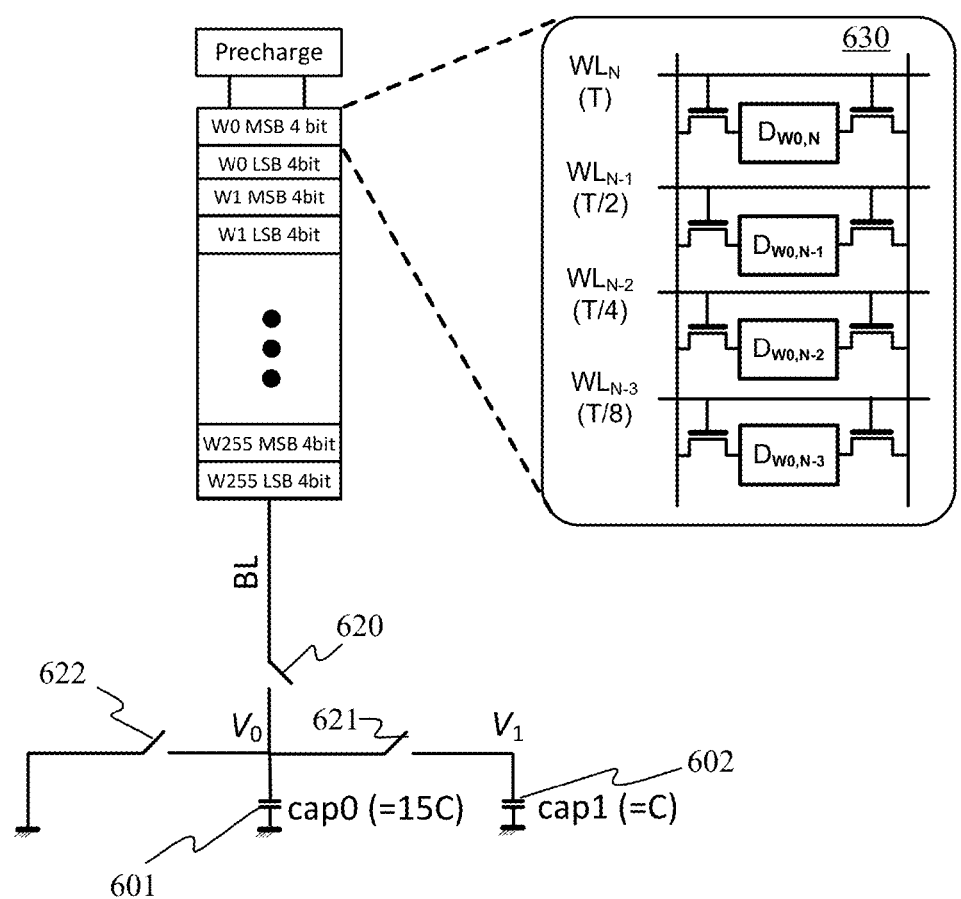
FIG. 6 illustrates a configuration for compute memory that enables a multi-row read of more than 8-bits.

FIG. 6 illustrates a configuration for compute memory that enables a multi-row read of more than 8-bits. For more than 8 bits (higher precision), a charge sharing technique is performed using two capacitors, cap0 601 and cap1 602, connected to the bit line. Three switches: first switch 620, second switch 621, and third switch 622 facilitate the charge sharing between the cap0 601 and cap1 602 (and ground). The charge sharing technique can be repeated as many times as desired to achieve the appropriate precision and perform the multi-row read for all the bits.

To provide the appropriate weighting of the bits, the capacitors cap0 601 and cap1 602 are of different sizes; in this case, cap0 601 is 15C and cap1 602 is 1C. A bit line is connected to the capacitors cap0 601 and cap1 602. For the LSB part of the word, there is a first access that dumps the charge on cap0 601. Then, voltage dividing is carried out using the two capacitors cap0 601 and cap1 602 and a ground line to obtain a 1/16 coefficient for the LSB value. Finally, for the MSB part of the word, the charge is dumped onto cap0 601 and then shared between cap0 601 and cap1 602.

In detail, the technique can begin at an initial condition where $V_0=V_1=0V$ (switches 621 and 622 are closed). Then, BL is precharged with the first switch 620 closed and the second and third switch 621, 622 open. In this state, the LSB 4 bit data 630 can then be multi-row read using the binary weighted pulses, resulting in the voltage at cap0 601 ($V_0$) equal to $V_{LSB}$. The first switch 620 is then opened and the second switch 621 is closed so that the charge in cap0 601 is shared to cap1 602. Since cap0 601 is 15 times the capacitance of cap1 602, $V_0=V_1=(15/16)V_{LSB}$. Next, $V_0$ is refreshed to 0V by opening the second switch 621 and closing the third switch 622. The third switch 622 is then opened and BL is precharged with the first switch 620 closed and the second switch 621 opened. In this state, the MSB 4 bit data can be multi-row read, resulting in $V_0=V_{MSB}$. The first switch 620 is opened and the second switch 621 is closed to dump the charge $V_0$ in cap0 601 to cap1 602. This results in a charge $$V_0 = V_1 = \frac{15}{16}\left(V_{MSB} + \frac{1}{16}V_{LSB}\right);$$

and the MSB data is weighted 16 times larger than the LSB data. This process can be repeated limitlessly to achieve higher precision.

As illustrated in FIGS. 4-6, four, 8, and even more than 8 bits may be read out in a multi-row read process. The result of the multi-row read is a voltage on the bit lines (and bit bar lines for SRAM implementations). The analog signal processor facilitates a number of computations. Indeed, the compute memory supports simple computations such as summation, subtraction, multiplication, and limited division, as well as more complex computations combining a variety of the simple computations.

Figure 7A:
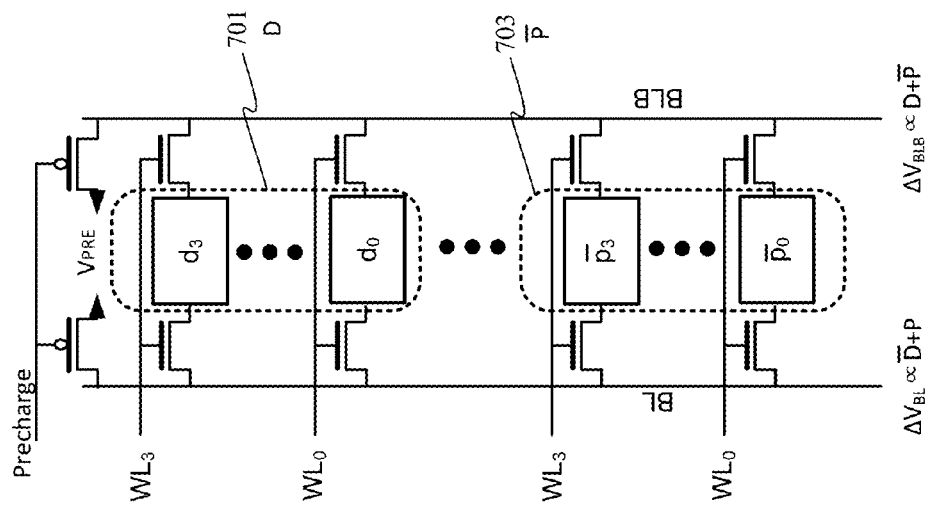
FIGS. 7A and 7B illustrate addition and subtraction.
Figure 7B:
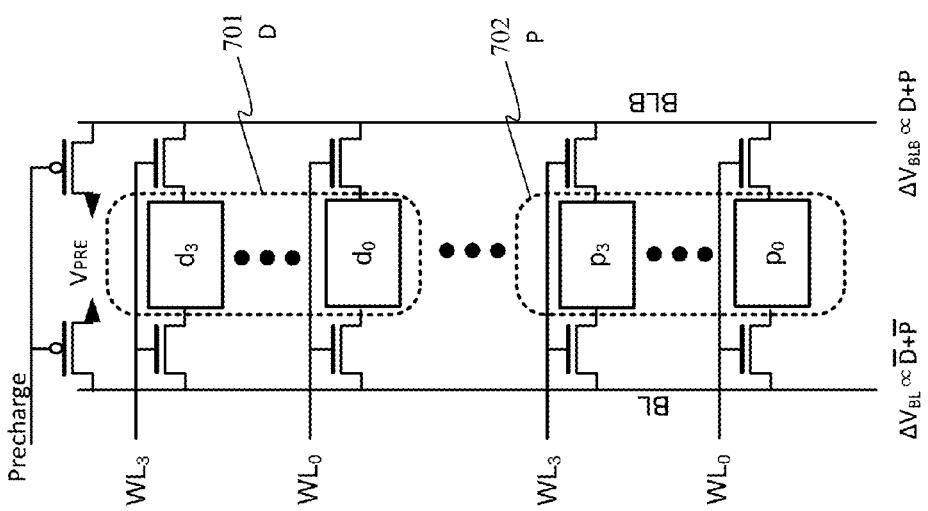
Figure 8:
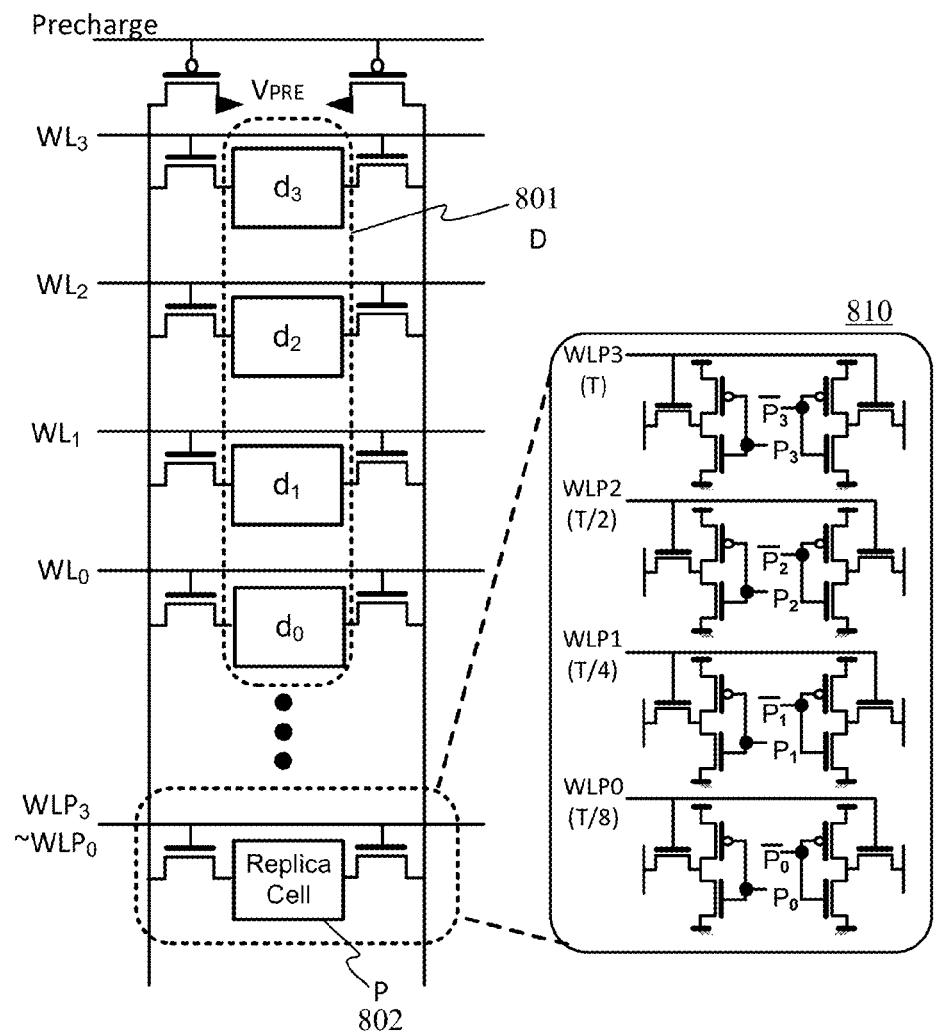
FIG. 8 illustrates a replica cell implementation for addition and subtraction.
Figure 9B:
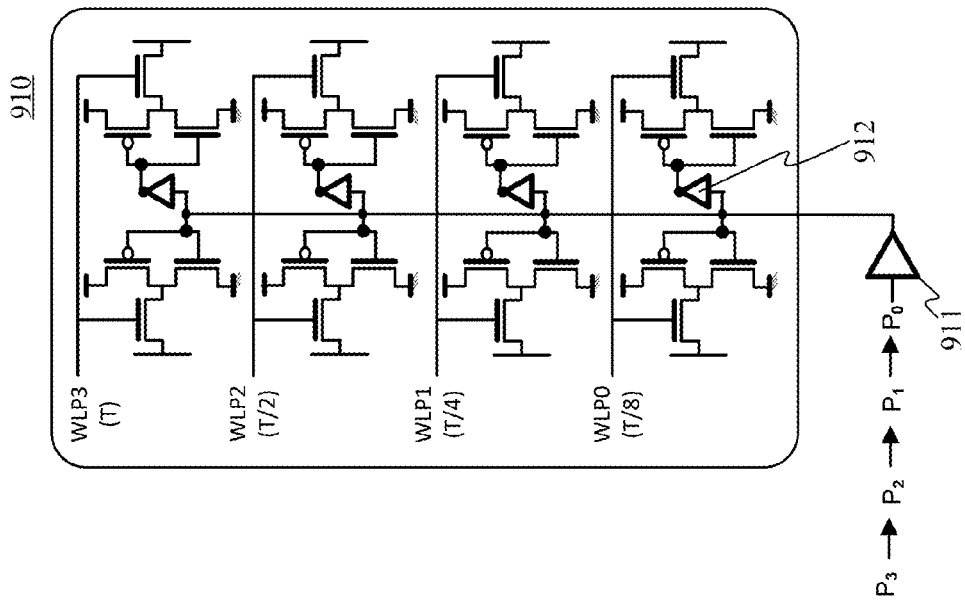
FIGS. 9A and 9B illustrate alternative implementations of a replica cell with reduced number of ports for external connection of the P data.
Figure 9A:
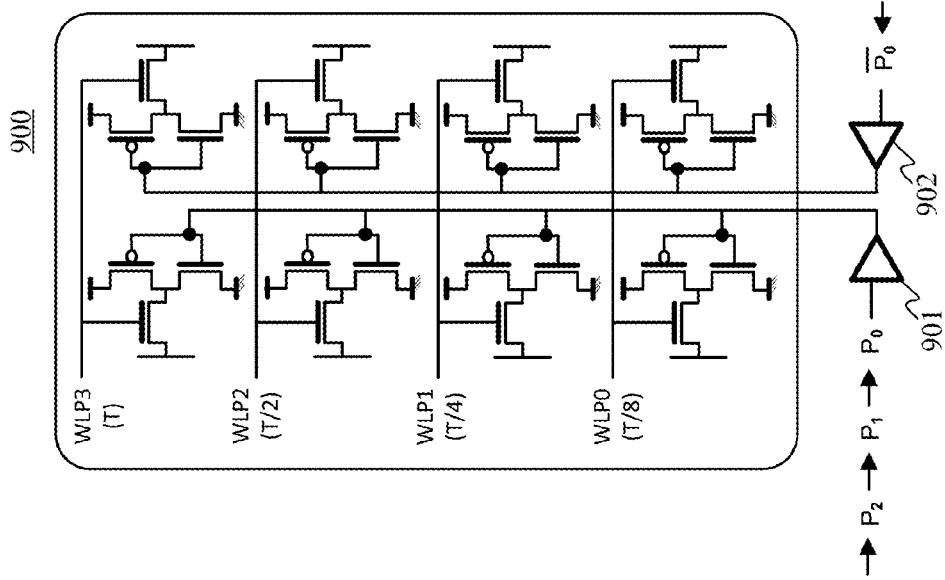

FIGS. 7A and 7B illustrate addition and subtraction. FIG. 8 illustrates a replica cell implementation for addition and subtraction; and FIGS. 9A and 9B illustrate alternative implementations of a replica cell with reduced number of ports for external connection of the P data. Summation is simply the result of the multi-row read. The resulting voltage is an analog representation of addition, which can be transformed back to a digital representation via an analog to digital converter.

Thus, to perform addition, the numbers being added are stored in the memory array. For example, a higher level application can write into the memory to store the data in the memory cells. For the simplest addition, the two numbers should be in the same column. As illustrated in FIG. 7A, the first word D 701 is read via the multi-row read and then the second word P 702 in the column is also read via the multi-row read. The combination is the addition of the two words D 701 and P 702 because ΔVBLB is proportional to D+P. Computation can be processed in high parallel manner without IO limitation because multiple columns can be read out simultaneously. This also achieves high energy efficiency because the computation is processed with a small voltage swing in a charge transferred manner.

Subtraction between D and P can be approximated with 2's complement representation (D−P→D+P̄+1). Accordingly, as illustrated in FIG. 7B, the reading of D 701 and consecutively reading P̄ 703 leads to the subtraction because subtraction can be regarded as an summation between D and P̄. The error of offset 1 (from the 2's complement representation) is created for all the columns equivalently. Thus, the error does not affect the performance of pattern recognition applications or other applications with this flexibility.

For the examples shown in FIGS. 7A and 7B, the summation (and subtraction) are available when both D and P (P̄) are pre-stored in memory array. For the case where P is not stored in the same column as D, a replica cell can be used such as shown in FIG. 8. A replica cell is not part of a typical SRAM array; a replica cell looks similar to an SRAM cell, but the inverter input is P and P̄, which can be provided before the multi-row read process is performed. In this case, D 801 is still stored in the memory array and then P (or P̄) 802 is applied to the replica cells 810.

The bits Pi and P̄i of data P 802 can be provided directly from external connection through ports as shown in FIG. 8. Then, the replica bit-cell operates with the almost same cell current as the normal bit-cells. Thus, the P 802 can be read without storing the value in the memory array. For the implementation illustrated in FIG. 8, an additional port for two inputs into each of the replica cells is included. That is, bit line, bit line bar, word line, and the two ports for p and p bar are needed for the replica cell, resulting in a larger area being taken up as compared to the conventional memory cell. To increase the density of the replica cells, the number of ports to the replica cells can be reduced through the implementations illustrated in FIGS. 9A and 9B. For example, as shown in FIG. 9A, a word can be written into a replica cell 900 of a plurality of replica bit-cells by sequentially applying the bits through two external port drivers: Pi driver 901 and P̄i driver 902. For the example shown in FIG. 9B, the replica cell 910 can have a single external port driver 911 through which p data is sequentially applied. In the case illustrated in FIG. 9B, an inverter 912 is included for each replica bit-cell to provide the p bar data from the p data.

Figure 10:
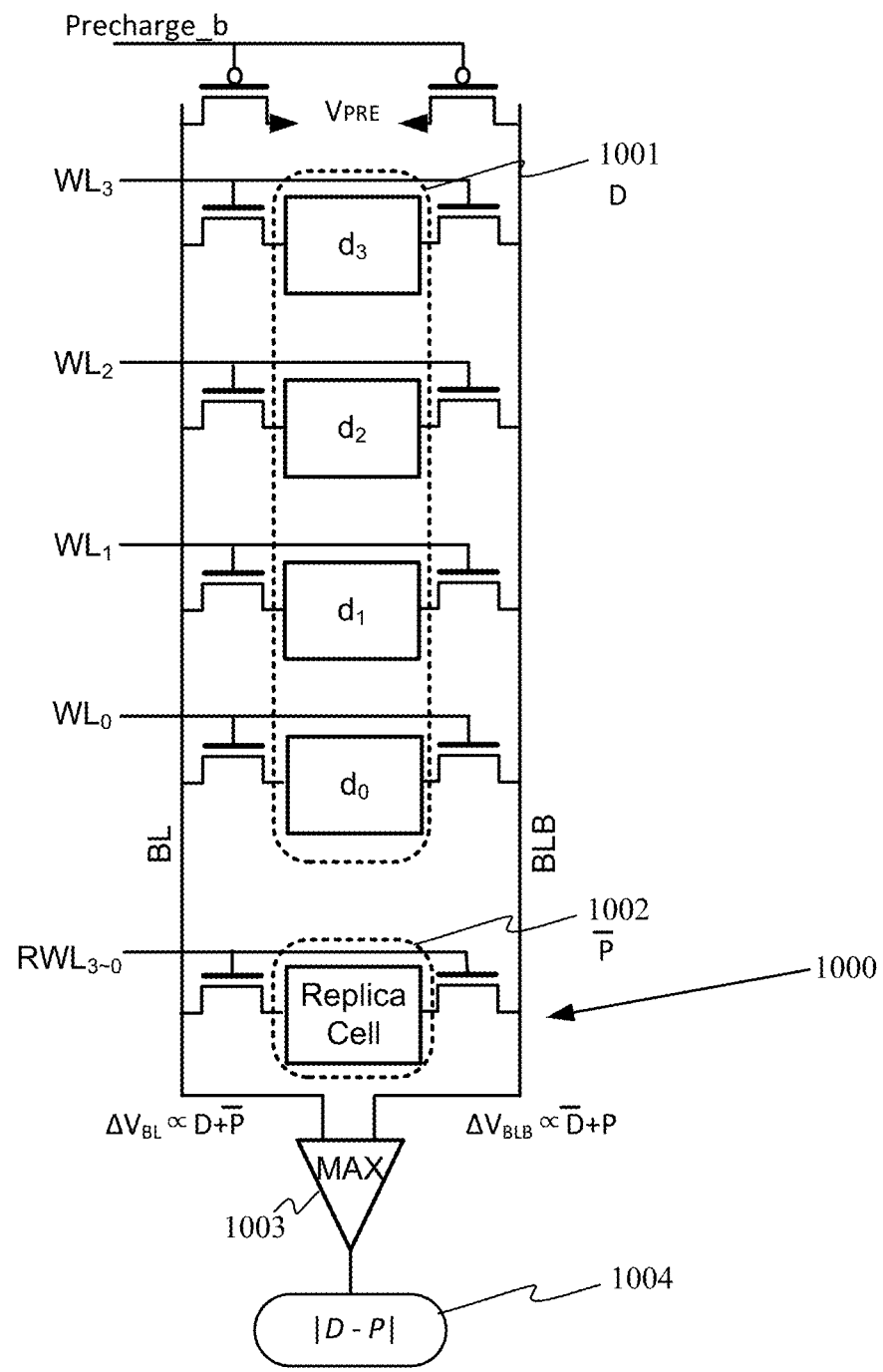
FIG. 10 illustrates absolute difference.

FIG. 10 illustrates absolute difference. The absolute difference is a comparison between BL and BLB of a column of the array. The replica cell 1000 can also be used for computing absolute difference. To generate the absolute difference of D data 1001 and P data 1002 (i.e., |D−P|), an analog comparator 1003 is included (as part of the analog processor). The analog comparator 1003 can be implemented by a differential amplifier or sense amplifier. As with the subtraction described with respect to FIGS. 7 and 8, absolute difference involves adding D data to $\overline{P}$ data to obtain the result of D−P on the BLB (and P−D on BL). To obtain the absolute difference, the maximum value between D−P and P−D is determined through the comparator 1003, which outputs the result from the bit line (BL or BLB). This result 1004 is the absolute difference.

Figure 11B:
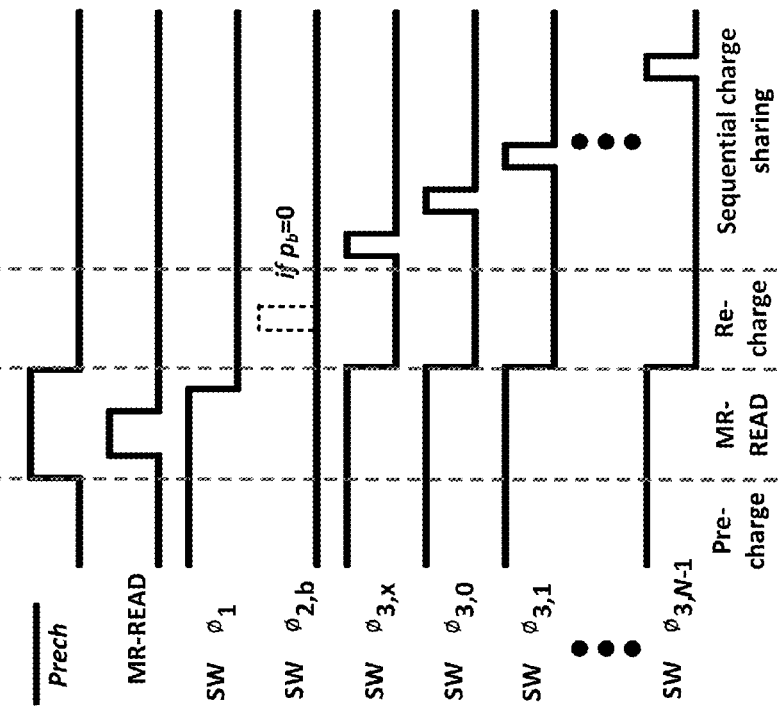
FIGS. 11A and 11B illustrate multiplication.
Figure 11A:
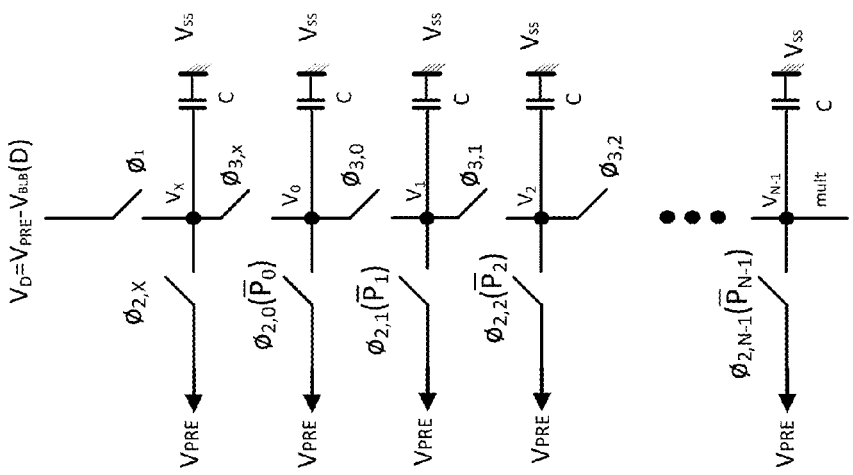

FIGS. 11A and 11B illustrate multiplication. FIG. 11A shows a schematic representation of an analog processing component for multiplication and FIG. 11B illustrates a timing diagram for the switches. The capacitor multiplier illustrated in FIG. 11A would connect at the bottom of BL for any of the configurations shown in FIG. 7, 8, 9A, or 9B.

An analog voltage stored in a capacitor can be divided by charge-sharing with a same amount of refreshed capacitor, and N repetition of the same process achieves division by $2^N$. The multiplication between analog value D and N-bit digital value P is supported by a capacitive multiplier, where D is the stored value in the memory (not shown), and the P is an externally provided value. For multiplication, as illustrated in FIG. 11B, BL and BLB are precharged to VPRE with the switches controlled by $\varnothing_1$ and the $\varnothing_3$s closed and the switches controlled by the $\varnothing_2$s opened. Then, a multi-row read of data D is carried out, which results in $V_X=V_0=V_1=\ldots=V_{N-1}=V_D=V_{PRE}-\Delta V_{BLB}(D)$. The switches controlled by the $\varnothing_{2,i}$s are opened or closed when the $\overline{P}$i is 0 and 1 respectively, whereas $\varnothing_2,x$ remains closed. Thus, the capacitor corresponding to the bit position i is connected to the $V_{PRE}$, and thus, the $\Delta V_{BLB}(D)$ disappears when Pi=0.

For example, the switches controlled by $\varnothing_1$ and the $\varnothing_3$s are opened; then $\varnothing_{2,0}$ is closed, resulting in $V_X=V_{PRE}$. When Pi=0, the switches controlled by the $\varnothing_2$s are closed and $V_i=V_{PRE}$. Otherwise, the switches controlled by the $\varnothing_2$s are opened. Next, the switch controlled by $\varnothing_{3,0}$ is closed, resulting in $V_0=V_{PRE}-0.5p_0V_D$. Then, the switch controlled by $\varnothing_{3,0}$ is opened and the switch controlled by $\varnothing_{3,1}$ is closed, resulting in $V_1=V_{PRE}-0.5(p_1V_D+0.5p_0V_D)$. Then, the switch controlled by $\varnothing_{3,1}$ is opened and the switch controlled by $\varnothing_{3,2}$ is closed, resulting in $V_2=V_{PRE}-0.5(p_2V_D+0.5(p_1V_D+0.5p_0V_D))$. Then, the switch controlled by $\varnothing_{3,2}$ is opened and the switch controlled by $\varnothing_{3,3}$ is closed, resulting in $V_2=V_{PRE}-0.5(p_3V_D+0.5(p_2V_D+0.5(p_1V_D+0.5p_0V_D)))$. This can be carried out until all data P has been applied, resulting in $V_{out}=V_{PRE}-0.5V_D(p_{N-1}+0.5p_{N-2}+0.25p_{N-3}+0.125p_{N-4}\ldots)=V_{PRE}-\text{constant value}\times V_D\times P$. The voltage drop as compared to $V_{PRE}$ at the node mutt stores the result of multiplication between D and P.

Figure 12:
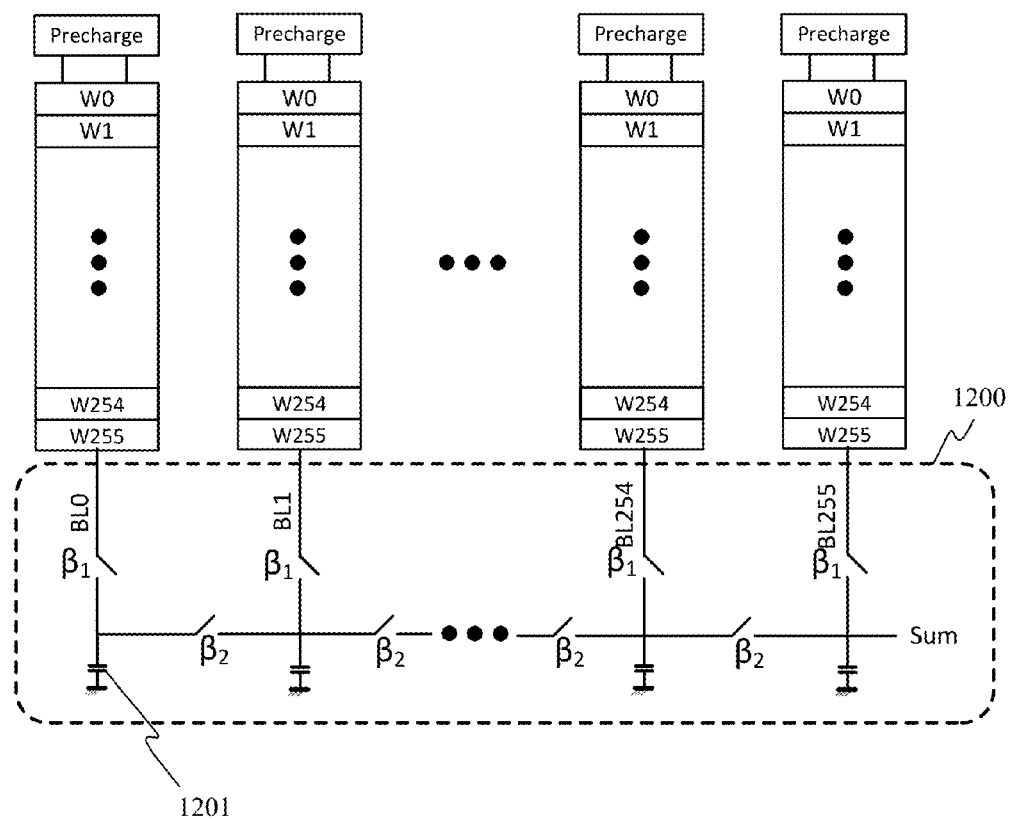
FIG. 12 illustrates summation across bit lines.

FIG. 12 illustrates summation across bit lines. In addition to summation between values of a same column, the summation can be applied for the values in 2-dimensional space across multiple columns and rows by employing a capacitive adder 1200. The charge of either BL or BLB, after the multi-row read of a particular column is loaded onto the corresponding column capacitor 1201 by closing the switches controlled by $\beta_1$. The values stored on all of the corresponding column capacitors are summed by closing the switches controlled by $\beta_2$. In some cases, the result can be stored in row capacitors (see ROWi illustrated in FIG. 14, which stores the charge when the switches controlled by $\beta_{3,i}$ are closed) and the process repeated as desired, for example, for as many times as there are rows.

The basic computational blocks can be combined in various ways to implement more complex calculations such as, but not limited to, sum of absolute differences, inner product/cross-correlation, and a Hamming distance.

Example—Compute Memory for Pattern Recognition

Pattern recognition is a common kernel for classification in machine learning, for example, when applied to spam filtering, optical character recognition, search engines, or computer vision. Pattern recognition is also used for the multimedia applications such as object detection or speech recognition. Pattern recognition involves either a determination of a most likely match (e.g., a "fuzzy" match) or an exact match for the inputs of the system. When an exact match for an input is sought with respect to pre-existing patterns, the pattern recognition is referred to as pattern matching; however, the two terms (pattern precognition and pattern matching) often are used interchangeably in common vernacular.

During pattern recognition, a system finds the closest pattern match between a database of original data D and a given pattern template P.

Figure 13:
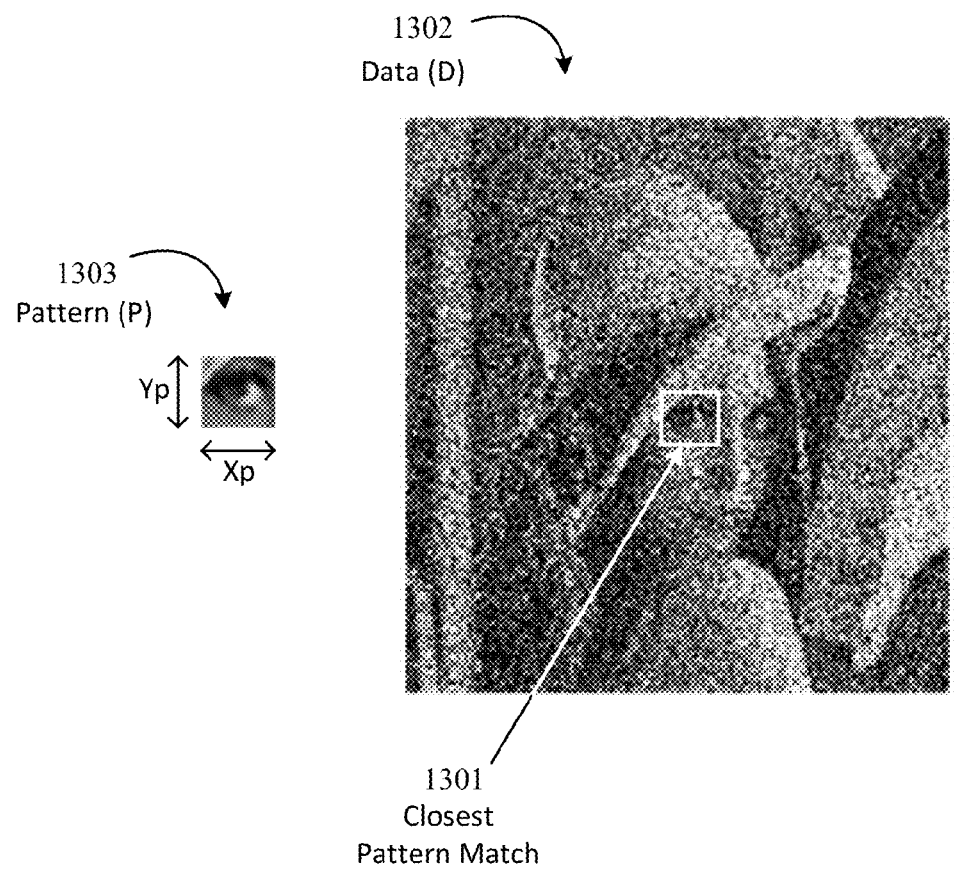
FIG. 13 illustrates a representation of an example pattern recognition process.

One popular similarity metrics for pattern recognition involves the sum of absolute difference (SAD). SAD is widely used for motion estimation, stereo matching, and video compression. SAD finds a closest pattern match 1301 between stored data D 1302 and a pattern template P 1303, as illustrated in the example image pattern recognition shown in FIG. 13. This can be expressed as SAD (x, y)=$\Sigma_{i,j}$|D (i+x, j+y)−P(i, j)|, where (x, y) is the pointer address of particular data D, $0 \leq i \leq Y_{P-1}$, $0 \leq j \leq X_{P-1}$, and $Y_P \times X_P$ is the size of P and D. The closest pattern is the result having a minimum SAD.

Figure 14:
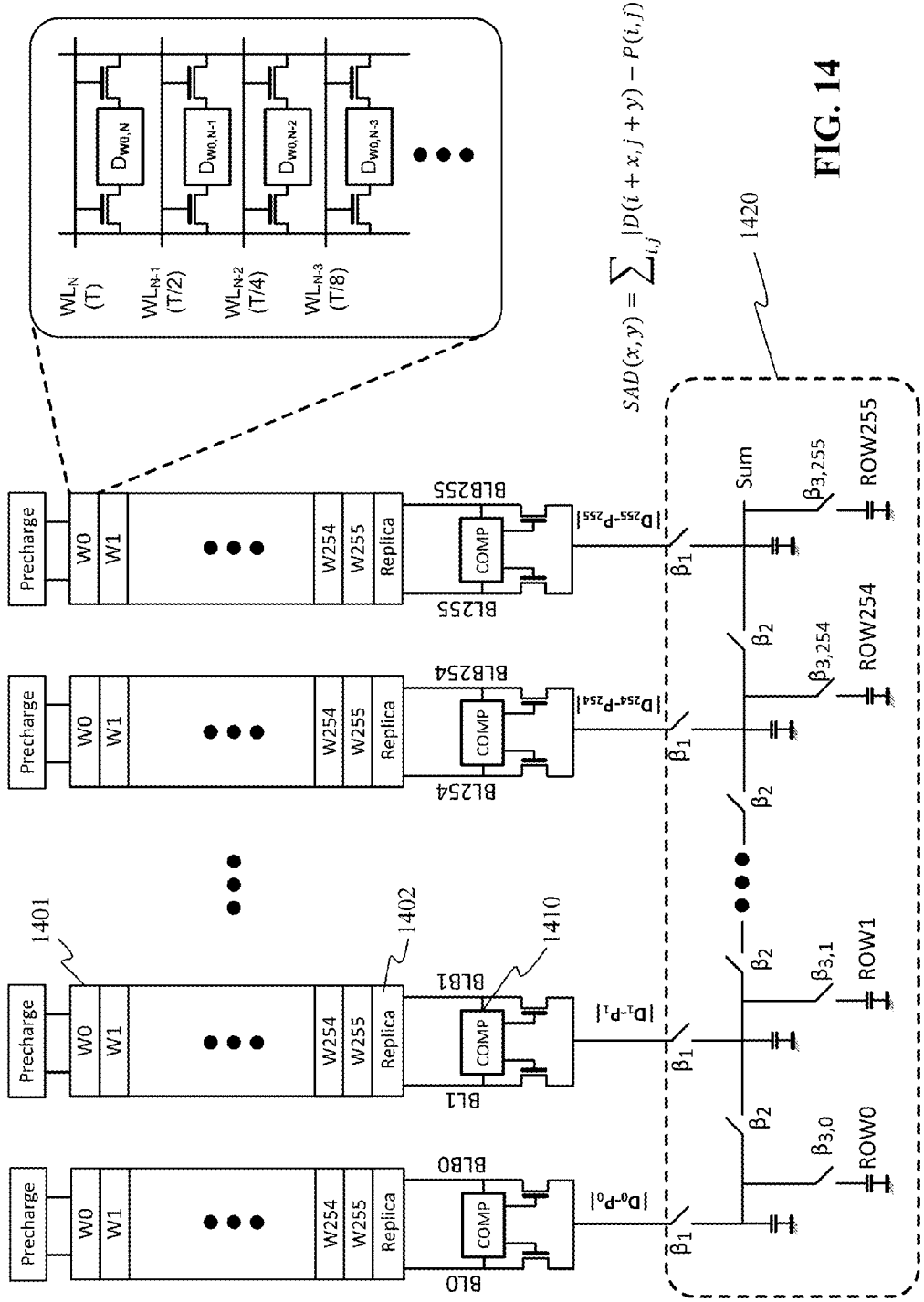
FIG. 14 illustrates a schematic diagram of an example SAD computation arrangement for pattern recognition using compute memory.

FIG. 14 illustrates a schematic diagram of an example SAD computation arrangement for pattern recognition using compute memory. Advantageously, instead of requiring repetitive memory accesses to the pre-stored data 1302 followed by digital computations, the described compute memory performs an analog SAD computation with parallel processing. The SAD computation evaluates the absolute difference |D−P|, which can be written as max(D+$\overline{P}$, P+$\overline{D}$), where $\overline{D}$ and $\overline{P}$ are the 1's complement of D and P, respectively. The analog SAD computation begins with performing a multi-row read of vertically-stored (in a column) bits (equal to a word of D and a word of P) over the memory array, where the template P is applied across the memory array storing D. For example, the column may have both D and P (and/or $\overline{P}$) stored in the memory array. In some cases, particularly where P changes relatively frequently, D is stored into memory cells 1401 of the memory array and P (and/or $\overline{P}$) is written into a replica cell 1402 for that column being read out. Depending on the size of the words, a sub-range read (as described with respect to FIG. 5) or higher precision read (as described with respect to FIG. 6) may be performed.

Sequencers, as part of the row and column decoders such as described with respect to FIG. 2A, may be employed to slide the template P across the memory array storing D. For example, a memory array (e.g., SRAM memory array 202) stores (or is written to store) a full image (e.g., pre-stored data D 1302). The pattern template P 1303 may be a 16×16 window so the sequencer chooses 16 sequential rows (and columns) for the SAD computation and the pattern template P 1303 is written into the appropriate replica cells.

As explained above, addition can be performed by employing width modulated word line pulses with T, T/2, T/4, and T/8 as examples (generating a binary weighted sum of the word at the bit line). If the template pattern P is stored with the polarity opposite to that of D, a multi-row read of D followed by a multi-row read of P (where the two words are in a same column) results in $\Delta V_{BL}$ and $\Delta V_{BLB}$ being proportional to P+$\overline{D}$ and D+$\overline{P}$, respectively. A local bit line comparator 1410 is then used to provide the maximum of $\Delta V_{BL}$ and $\Delta V_{BLB}$.

The outputs of the local bit line comparator can be summed up via a capacitive network 1420 using a charge transfer mechanism to generate the SAD for a location of a particular window size. In detail, the analog comparator 1410 connects either BL or BLB to the capacitor at its column while the switch controlled by $\beta_1$ is closed. The values stored at these column capacitors are summed by closing the switches controlled by $\beta_2$. This result can be stored at the row capacitors ROWi by closing the switches controlled by the $\beta_3$s. The $\beta_1$ and $\beta_2$ signals may be provided as $\beta_1$s and $\beta_2$s signals (e.g., ($\beta_{1,y}$ and $\beta_{2,y}$ for each set of columns) for more independent control of the summation for a set of columns, particularly for isolating parallel windows.

The process storing voltage from the column capacitors to the row capacitors is repeated until all the rows in the memory array corresponding to the window and the rows of the replica cells (1402) have been accessed. Then, the voltage corresponding to SAD is obtained on the SUM node by closing the switches controlled by $\beta_2$ and $\beta_3$s. In some cases, the row capacitors can be connected by switches to the SUM node controlled by a fourth signal so that the switches controlled by $\beta_2$ and $\beta_3$s remain open. The SAD voltages for multiple windows across the columns of the memory array can be computed in parallel. The voltage on the SUM nodes can be converted into digital values by, for example, a single ramp analog to digital converter (ADC). The ADC may include a counter, a voltage ramp generator, and a plurality of comparators and registers. A comparator and register of the plurality of comparators and registers may be provided for each corresponding window-sized set of columns.

A global comparator (not shown) can keep track of the minimum SAD to generate the final output. For example, the digital SAD values can be compared in a digital comparator to obtain a temporary minimum and its pointer address, which keeps getting updated as the next set of rows are processed. Advantageously, it is just the current SAD value that is fetched out to the comparator processor; only one SAD value is sent, not the whole pixel value, providing a more efficient computation.

Another computation that may be used for pattern recognition is cross-correlation. Cross-correlation/inner product can also be used for signal detection (e.g., electron tomography), weather forecasting, determining an average value, and cryptography.

Figure 15:
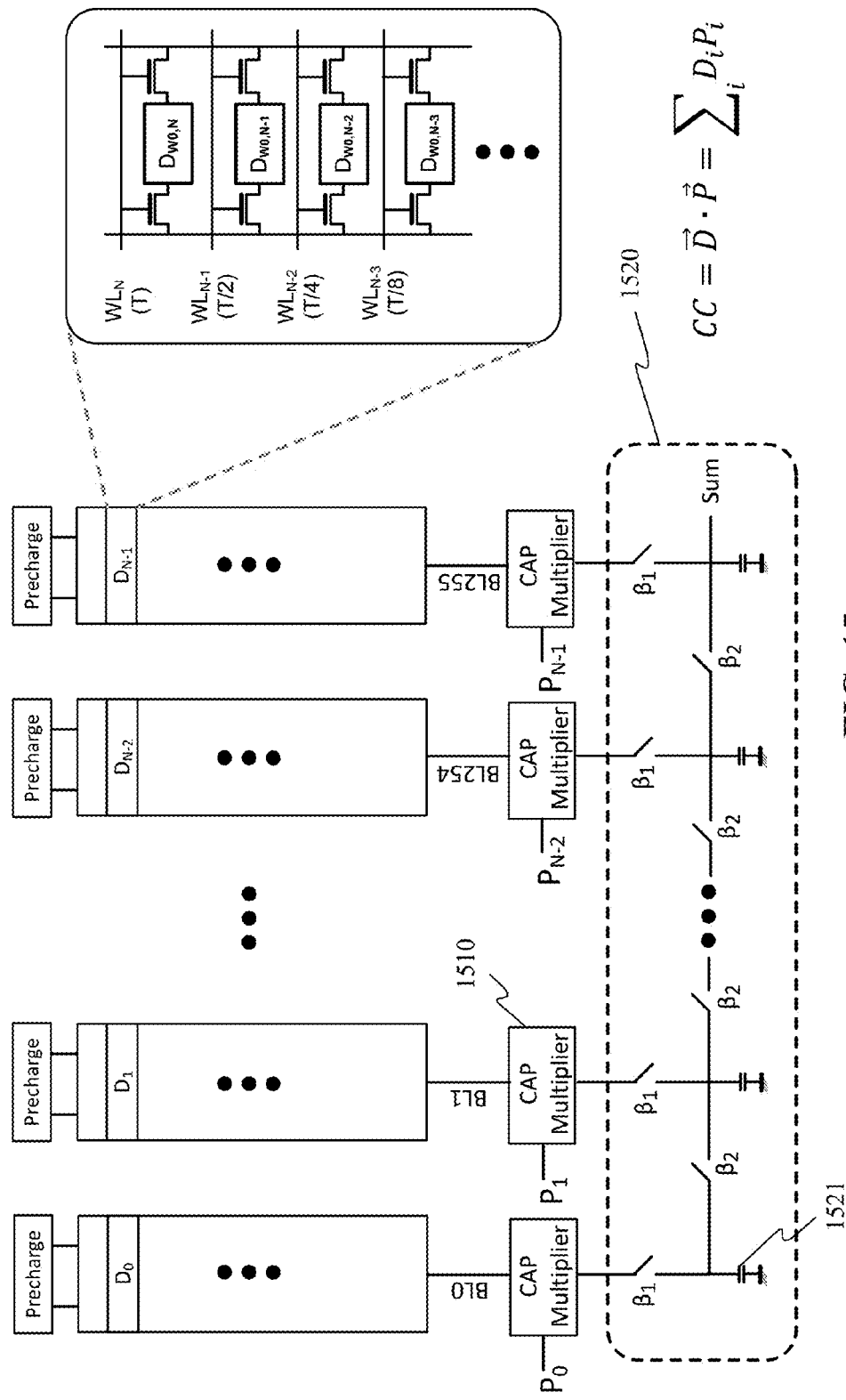
FIG. 15 illustrates a schematic diagram of an example inner product/cross-correlation computation arrangement using compute memory.

FIG. 15 illustrates a schematic diagram of an example inner product/cross-correlation computation arrangement using compute memory. Referring to FIG. 15, after performing a multi-row read according to any of the read configurations described herein (e.g., with respect to FIGS. 3, 5, and 6), multiplication of the D and P bits is carried out using a CAP multiplier 1510 (such as described with respect to FIGS. 11A and 11B) and then the product is summed across the columns via a capacitive network 1520. In particular, after performing the multiplication at the CAP multiplier 1510, the output of each CAP multiplier 1510 is stored to a capacitor 1521 with 131 closed and 132 open. Then, by closing 132, the voltages of the bit lines are merged by charge sharing.

Example—Compute Memory for the computation of Hamming Distance

Figure 16A:
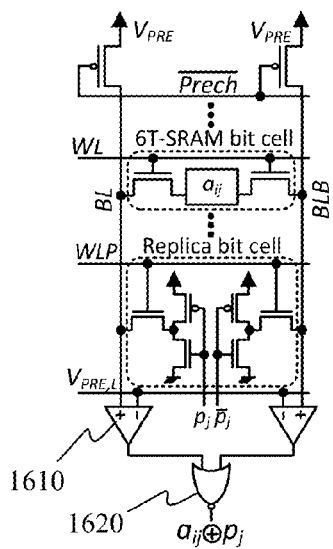
FIGS. 16A-16C illustrate an example Hamming distance computation arrangement using compute memory.
Figure 16B:
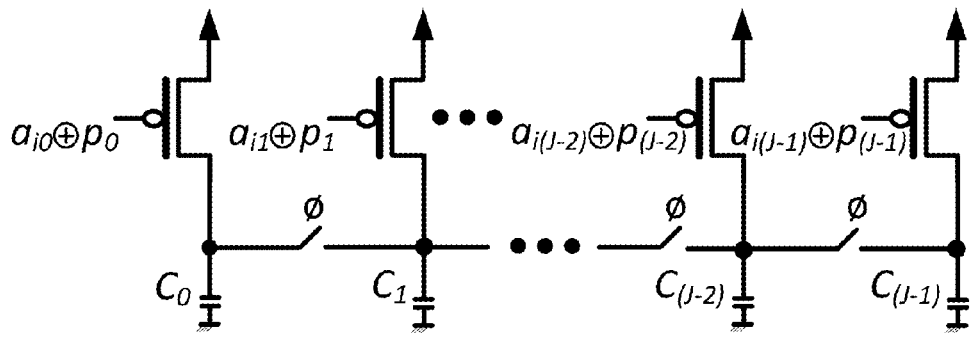
Figure 16C:
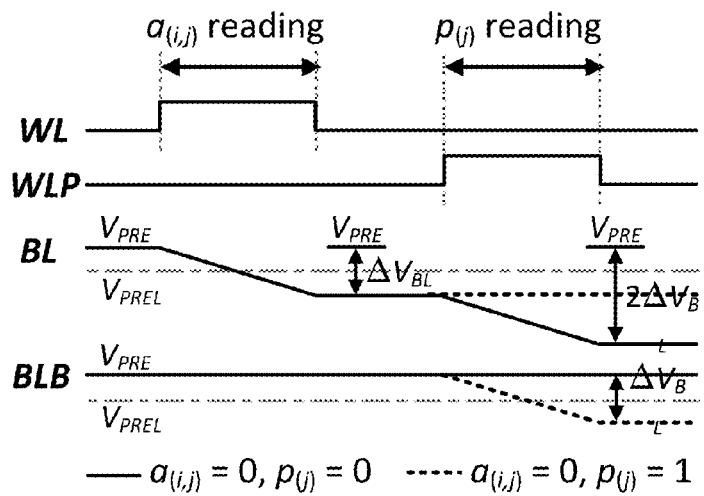

FIGS. 16A-16C illustrate an example of Hamming distance computation, H (i)=$\Sigma_{i,j}$ a(i, j)$\oplus$p (j) using compute memory. Referring to FIG. 16A, all columns may be read at the same time. Advantageously, there is no bottleneck from IO bus-width. The increased throughput can provide less leakage with power gating. With the embedded analog signal processing, digital blocks can be omitted, saving energy and area.

For simplicity of implementation, the computation is transformed as follows:

$$a(i, j) \oplus p(j) = \overline{\text{sgn}\{0.5 - (a(i, j) + p(j))\} + \text{sgn}\{0.5 - (\overline{a(i, j)} + \overline{p(j)})\}},$$

$$\text{sgn}(x) = \begin{cases} 1, & \text{if } x \geq 0 \\ 0, & \text{otherwise} \end{cases}.$$

The multi-row read processes the addition of a(i, j) and p(j) in the analog domain by reading a(i, j) and consecutively reading p(j) through the replica bit. The analog processor stage for the Hamming distance includes an analog comparator 1610 at the bit lines BL and the bit line bar BLB lines for each column. The analog comparator 1610 takes the BL or BLB line as the positive input and a low precharge voltage, $V_{PREL}=V_{PRE}-\Delta V_{BL}/2$ as the reference, or negative, input, where $\Delta V_{BL}$ is the voltage drop on the bit lines during a read operation. The output of the two analog comparators 1610 for the BL and BLB lines of a column are provided as input to a NOR gate 1620 so that the output of the NOR gates provides the computation of a(i, j)$\oplus$p(j), and is connected to a capacitive adder as illustrated in FIG. 16B to output the Hamming distance H (i)=$\Sigma_{i,j}$ a(i,j)$\oplus$p (j). The timing diagram is illustrated in FIG. 16B, which shows an example of the timing for the multi-row read.

It should be understood that the examples and embodiments described herein are for illustrative purposes only and that various modifications or changes in light thereof will be suggested to persons skilled in the art and are to be included within the spirit and purview of this application.

We claim:
1. A compute memory, comprising:
 a memory array; and
 a controller that provides, for a read operation, N-ary weighted access pulses for a set of word lines of the memory array, wherein a width of an access pulse of the N-ary weighted access pulses is based on its N-ary weight.

2. The compute memory of claim 1, wherein the controller provides the N-ary weighted access pulses as binary weighted access pulses for the set of word lines of the memory array per a precharge of a bit line of the memory array.

3. The compute memory of claim 1, further comprising:
 an embedded analog processor connected to bit lines of the memory array.

4. The compute memory of claim 3, wherein the embedded analog processor comprises:
 a replica cell connected to a column of memory cells of the memory array.

5. The compute memory of claim 3, wherein the embedded analog processor comprises:
 a comparator having one input connected to a bit line of a column of memory cells of the memory array and another input connected to a bit bar line of the column of the memory cells.

6. The compute memory of claim 5, wherein the embedded analog processor further comprises:
 a capacitive adder connected to an output of the comparator.

7. The compute memory of claim 3, wherein the embedded analog processor comprises:

a capacitive multiplier connected to a bit line of a column of the memory cells and receiving a P data input.

8. The compute memory of claim 7, wherein the embedded analog processor further comprises:
a capacitive adder connected to an output of the capacitive multiplier.

9. The compute memory of claim 3, wherein the embedded analog processor comprises:
a capacitive adder connected to the bit lines of the memory array.

10. The compute memory of claim 3, wherein the embedded analog processor comprises:
a bit line analog comparator, a bit bar line analog comparator, and an NOR gate connected to the bit lines of the memory array, wherein a positive input of the bit line analog comparator is connected to the bit line of the column of the memory cells, a positive input of the bit bar line analog comparator is connected to the bit bar line of the column of the memory cells and outputs of the bit line analog comparator and the bit bar line analog comparator are connected as input to the NOR gate.

11. The compute memory of claim 10, wherein the embedded analog processor further comprises:
a capacitive adder, wherein an output of the NOR gate is connected to a gate of a common-source transistor connected to the capacitive adder.

12. The compute memory of claim 1, further comprising:
an input interleaver for arranging data to be written into the memory array so that words are stored column-wise.

13. A method of operating compute memory, comprising:
performing a multi-row read of a column of a memory array having data stored therein, wherein performing the multi-row read of the column comprises:
applying a first pulse of width T to a first word line of the memory array;
applying a second pulse of width T/2 to a second word line of the memory array;
applying a third pulse of width T/4 to a third word line of the memory array; and
applying a fourth pulse of width T/8 to a fourth word line of the memory array.

14. The method of claim 13, wherein performing the multi-row read of the column further comprises:
precharging a bit line and a bit bar line of the column a single time before applying the first pulse, the second pulse, the third pulse, and the fourth pulse.

15. The method of claim 13, wherein the column stores a 4 bit word, a most significant bit of the 4 bit word being accessed via the first word line and a least significant bit of the 4 bit word being accessed via the fourth word line.

16. The method of claim 13, wherein the column stores an 8-bit word, wherein performing the multi-row read of the column further comprises:
applying the first pulse of width T to a fifth word line of the memory array;
applying the second pulse of width T/2 to a sixth word line of the memory array;
applying the third pulse of width T/4 to a seventh word line of the memory array;
applying the fourth pulse of width T/8 to an eighth word line of the memory array, wherein least significant bits of the 8-bit word are accessed via the first word line, the second word line, the third word line, and the fourth word line; and most significant bits of the 8-bit word are accessed via the fifth word line, the sixth word line, the seventh word line and the eighth word line; and applying, via charge sharing, a 1/16 weight to a bit line voltage representing the least significant bits.

17. The method of claim 13, wherein the column stores at least an 8-bit word, wherein least significant 4 bits of the at least 8-bit word are accessed via the first word line, the second word line, the third word line, and the fourth word line, wherein performing the multi-row read of the column further comprises:
connecting a bit line or a bit bar line of the column to a first capacitor so that bit line voltage representing the least significant 4 bits charges the first capacitor from an initial state after, the first capacitor being 15 times the capacitance of a second capacitor;
connecting the first capacitor to the second capacitor so that charge from the bit line voltage representing the least significant 4 bits is shared between the first capacitor and the second capacitor;
disconnecting the first capacitor from the second capacitor and connecting the first capacitor to a ground line to discharge the first capacitor;
disconnecting the first capacitor from the ground line and reconnecting the first capacitor to the bit line or bit bar line of the column;
applying the first pulse of width T to a fifth word line of the memory array, applying the second pulse of width T/2 to a sixth word line of the memory array, applying the third pulse of width T/4 to a seventh word line of the memory array, and applying the fourth pulse of width T/8 to a eighth word line of the memory array, wherein the bit line voltage representing higher significance bits than the least significant 4 bits charges the first capacitor after reconnecting the first capacitor; and
connecting the first capacitor having the bit line voltage representing the higher significance bits to the second capacitor so that charge from the bit line voltage representing the higher significance bits is combined with charge from the least significant 4 bits at the second capacitor.

18. The method of claim 13, further comprising:
performing an addition or a subtraction computation, wherein performing the addition or subtraction computation comprises:
performing the multi-row read of the column of the memory array to read out a first voltage representative of a data D on a bit bar line or a bit line connected to the column of the memory array; and
performing a second multi-row read of P data or P bar data to read out a second voltage representative of the P data or the P bar data on the bit line or the bit bar line,
wherein a total voltage on the bit line or the bit bar line after performing the multi-row read and the second multi-row read of the column represents a result of the addition or the subtraction.

19. The method of claim 13, further comprising:
performing an absolute difference computation, wherein performing the absolute difference computation comprises:
performing the multi-row read of the column of the memory array to read out a first voltage representative of a data D on a bit bar line and data D bar on a bit line connected to the column of the memory array;
performing a second multi-row read of a replica cell connected to the column of the memory array to read out a second voltage representative of a P data on the bit line and a P bar data on the bit bar line; and
outputting a maximum of the bit line and the bit bar line to provide a result of the absolute difference.

20. The method of claim 13, further comprising:
performing multiplication or division using P data or P bar data to control switches connecting a precharge voltage to corresponding capacitors that are connected to a bit line as a capacitive adder.

21. The method of claim 13, further comprising:
performing a sum of absolute difference computation, wherein performing the sum of absolute difference computation comprises:
performing an absolute difference computation by, for each column in a window:
performing the multi-row read of the column of the memory array to read out a first voltage representative of a data D on a bit bar line and data D bar on a bit line connected to the column of the memory array;
performing a second multi-row read of a replica cell connected to the column of the memory array to read out a second voltage representative of a P data on the bit line and a P bar data on the bit bar line; and
outputting a maximum of the bit line and the bit bar line to provide a result of the absolute difference;
combining the result of the absolute difference using a capacitive adder to generate a SAD value; and
comparing the SAD value to a prior SAD value to identify a minimum SAD value and its corresponding window location in the memory array.

22. The method of claim 13, further comprising:
performing a cross-correlation computation, wherein performing the cross-product computation comprises:
performing multiplication using P data or P bar data to control switches connecting a precharge voltage to corresponding capacitors that are connected to each bit line of the memory array as a capacitive adder; and
combining a result of the multiplication from each bit line using a capacitive adder to generate a cross-correlation value.

* * * * *